United States Patent
Drinkard et al.

(10) Patent No.: US 6,493,653 B1
(45) Date of Patent: Dec. 10, 2002

(54) TAPPED DELAY LINE HIGH SPEED REGISTER

(75) Inventors: John Drinkard, Redwood City, CA (US); Ed Oltman, Madison, WI (US); Galen Knode, Raleigh, NC (US)

(73) Assignee: Scientific Technologies Incorporated, Redwood City, CA (US)

( * ) Notice: Subject to any disclaimer, the term of this patent is extended or adjusted under 35 U.S.C. 154(b) by 201 days.

(21) Appl. No.: 09/728,567

(22) Filed: Nov. 28, 2000

(51) Int. Cl.[7] .............................. H03K 3/01; H03K 5/159
(52) U.S. Cl. ......................................... 702/176; 327/261
(58) Field of Search .................... 702/176, 177; 327/261, 262, 285

(56) References Cited

U.S. PATENT DOCUMENTS 5,317,219 A   5/1994   Lupi et al. .................. 307/603

OTHER PUBLICATIONS

S.A. Kleinfelder, A Multi–Gigahertz Analog Transient Recorder Integrated Circuit, 1992, University of California at Berkley M. Sci. Thesis, 56 pgs.

Gerald T. Przybylski, Analog Transient Waveform Digitizer R1.1 (V2), Mar. 5, 1998, 15 pgs.

*Primary Examiner*—Kamini Shah
(74) *Attorney, Agent, or Firm*—Coats & Bennett, P.L.L.C.

(57) ABSTRACT

A clockless time-of-flight interval timer includes a tapped delay line register comprising N buffers that each contribute a substantially identical incremental time delay. A latched version of a START pulse associated with an output of transmitted energy from a laser is propagated through the tapped delay line. A DATA signal representing a detected pulse returned from a target is coupled to a block of four comparators each having a different signal threshold. The output of each comparator block is provided as input to one of four channel registers, each register comprising N D-type flipflops separately but synchronously triggerable by tapped incrementally delayed outputs from the N buffers. Channel register outputs are multiplexed and decoded and interfaced with a microprocessor. The microprocessor determines first signal time over threshold (FOT) information and total time over threshold (TOT) information from the channel registers. The FOT provides a measure of time-of-flight, which measure can be corrected using TOT information and a look-up table containing timing walk incremental delay corrections for individual ones of the N buffers. TOT information can be used as an indicator of signal strength and thus may be used to correct for systematic errors in measured delay, which arise from fluctuation in signal strength.

46 Claims, 6 Drawing Sheets

TAPPED DELAY LINE HIGH SPEED REGISTER

FIELD OF THE INVENTION

The present invention relates generally to timing systems to measure short time intervals, and more particularly to timing systems suitable for time of flight pulse measurements such as found in systems used to guard protected equipment.

BACKGROUND OF THE INVENTION

In many applications it is necessary to know the distance between two points. Although knowledge of distance per se can be used to make a range finder, in other applications knowledge of distance can be used to protect a zone against intrusion. A factory may have robotic or potentially hazardous equipment that is to be protected from outsiders. A system that can measure the distance between such equipment and a perimeter region around the equipment can sound an alarm or turn-off the equipment if anyone approaches closer than the periphery of the protected zone. In this fashion, outsiders are protected against harm from the equipment, and any operators using the equipment are protected from harm by being startled or otherwise disturbed by outsiders.

Figure 1:
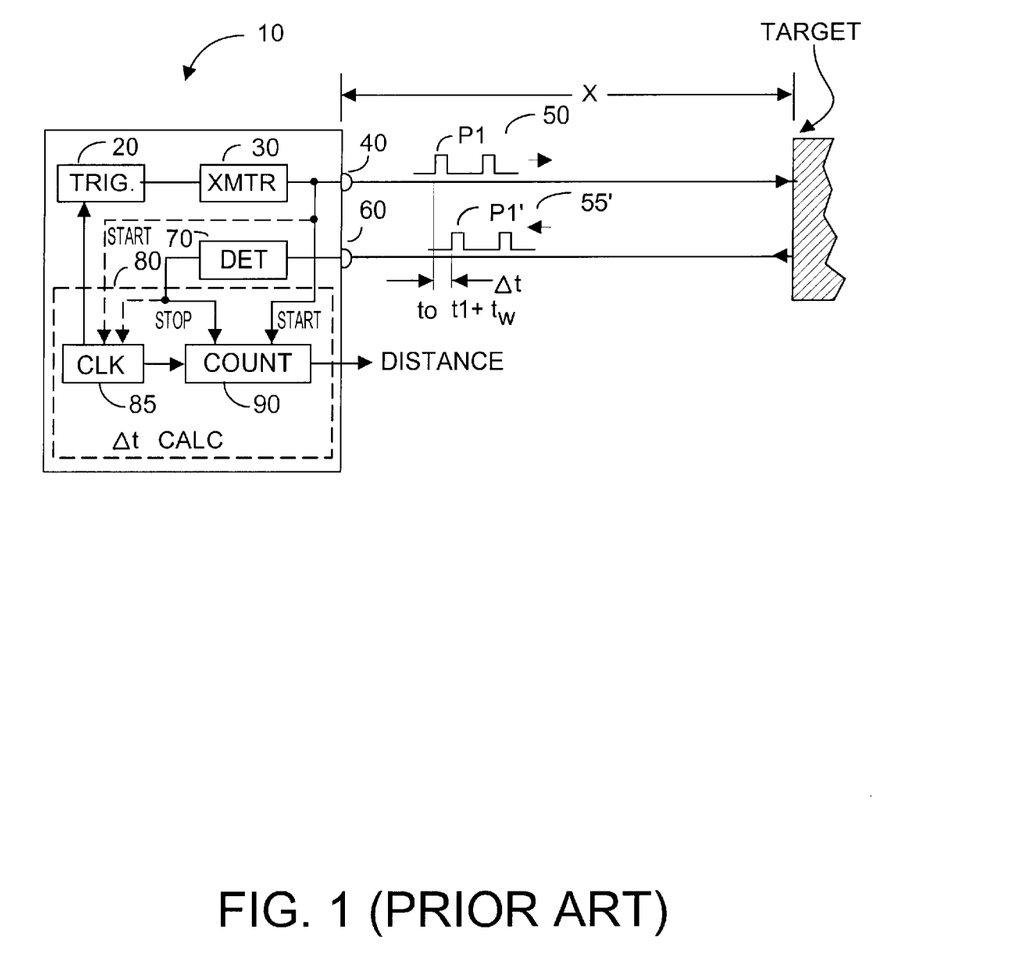
FIG. 1 depicts a generic time-of-flight measurement system, according to the prior art.

FIG. 1 depicts a generic so-called time-of-flight system 10 used to calculate the distance X between system 10 and a target (TARGET). System 10 may be located adjacent robotic or perhaps hazardous machinery in a factory where an alarm is to be sounded or the machinery turned-off if anyone approaches closer than distance X.

Typically system 10 includes a trigger generator 20 that creates a pulse train that is input to a transmitter (XMTR) 30, such as a high speed laser, that broadcasts a pulse via a suitable lens 40. The broadcast pulse 50 radiates outward at the speed of light, and at least a portion of the radiation may contact the surface of the target, and be reflected back toward system 10. The reflected-back radiation 55, which also travels at the speed of light, is detected by an appropriate transducer 60 (e.g., an optical lens) and photodetector 70. In a zone protection application, a mirror within system 10 mechanically rotates in a plane such that transmitted pulses scan the protected region, and return pulses are detected from this region. The protected region may be defined as a swept arc centered on the equipment to be protected, and extending outward with a radius of at least X. Typically the laser transmitter is triggered or pulsed with a known frequency in synchronism with mirror rotation such that detected return pulses can be correlated with an angle of emission, to locate the angular position and range of the intruding object. In such applications, any target (TARGET) within range X within the swept protection zone is presumed to be an intruder. Note that X may be a function of scan angle in that the guarded perimeter need not be defined by a swept arc.

As indicated in FIG. 1, there will be a phase or time shift between corresponding portions of the radiating pulse energy 50 and the return or reflected back radiation 55. Thus, at time t0 a first radiated pulse transitions 0-to-1, but the same pulse upon detection (denoted now P1') will have its leading edge transition 0-to-1 at time t1+Tw later than t0. A high speed counter logic unit 80 within system 10 then attempts to calculate the difference in time between t1+Tw and t0. Tw is a signal strength dependent term that is sometimes called "timing walk".

Within unit 10, detected return pulse P' is amplified and coupled to a comparator to determine the return pulse transition timing. Return pulse transition timing is typically dependent on the strength of the return pulse, which in turn is determined by object reflectivity and range. In FIG. 1, T1 is the delay corresponding to the physical separation between system 10 and the object or target, whereas Tw is the timing walk strength dependent term.

Typically unit 80 includes a high speed master clock 85 (CLK) and a high speed counter 90 (COUNT). At time t0, as determined by a START pulse associated with the beginning of an output emission 50, counter 90 begins to count clock pulses. At time t1+tw, when pulse P1' is detected, counter 90 is halted upon receipt of a STOP pulse, and the count value is determined.

Typically Tw is strongly dependent upon the signal response of the transmitter and receiver circuitry and must be characterized. Correction values are determined over a range of P1' signal strengths and are stored in a table. The values stored in the correction table are indexed by detected signal strength and may be used by a system control circuit to extract the value t1. Thus, prior art systems that employ time-interval counters typically will use a peak-detector or signal integrator.

Once t1 is known, a measure of distance x given At $\Delta t=(t1-t0)$ is determined by the following equation:

$$x = \frac{c \cdot \Delta t}{2}$$

where c=velocity of light (300,000 km/sec).

Within system 10, generating, transmitting, and receiving pulses can be straightforward. But it can be challenging for system 10 to resolve the distance X within a desired measurement granularity or tolerance. For example, to measure distance with a resolution granularity of about ±5 cm requires a 3 GHz counter. Such high speed devices are expensive and typically consume several watts of electrical power.

An alternative approach would be to replace the function of high speed clock 85 and high speed counter unit 90 with a high speed analog-to-digital converter. However high speed analog-to-digital converters are relatively expensive.

Yet another approach would be to replace units 85 and 90 with a transient recorder, perhaps inexpensively implemented using common CMOS fabrication processes. Transient recording could be extremely fast yet would not consume excessive electrical power. One prior art transient recorder technique is described in a Univ. of Calif. At Berkeley 1992 M. Sci. thesis entitled "A Multi-Gigahertz Analog Transient Recorder Integrated Circuit" by S. A. Kleinfelder. Kleinfelder's thesis described a tapped, active delay line using an array of storage capacitors. The capacitors stored samples of the detected return pulse P1' at specific delay times that were set by the delay of each element in the delay line.

Keinfelder's approach appears ideal in that it presents a fully digitized representation of the delayed pulse (or multiple pulses), at relatively minimal cost. Further, no thresholding of the analog return pulse is necessary, and range distance may be computed using an algorithm that takes into account the full pulse shape. The latter is important in determining target range, independently of the strength of the return pulse P1.

Unfortunately, in practice Kleinfelder's system is difficult to implement because of the large amount of data that must be processed in a relatively short time. Further, it is necessary to characterize performance of the active delay line and particularly the storage capacitors and analog-to-digital converter circuitry over process, temperature, and voltage variations.

What is needed is a high speed time interval measurement system for use in applications such as time-of-flight systems, especially in systems used to guard machinery or the like. Such measurement system should be inexpensive to fabricate, preferably using existing CMOS processes, should exhibit low power consumption, and should provide timing and strength information for one or more return pulses. Such measurement system should rapidly detect multiple return pulses, preferably within time intervals of less than about 500 ns, with a sub-nanosecond timing resolution that can provide spatial resolution of ±5 cm or less. Further, the system should measure return pulse signal strength with sufficient precision for use as an index to a lookup table to correct for timing walk. The system should communicate range measurements with a minimal amount of data. Finally, the system should exhibit reduced sensitivity to variations in ambient temperature, operating voltage, and fabrication processes.

The present invention provides such a high speed measurement system.

SUMMARY OF THE INVENTION

The present invention provides a high speed time interval system to measure time intervals $\Delta t$ in time-of-flight measurement systems, preferably for use in systems that guard the perimeter of machinery or the like. The system measures time interval between a transmitted scanned laser pulse and a return pulse to determine distance, and can be fabricated on an integrated circuit (IC) using generic components. But unlike prior art systems, the system also returns a measurement of the width of the detected return pulse. Such information is used as indices to a lookup table that stores time walk corrections to the measured range distance. Knowledge of the return pulse width permits inferring strength of the return pulse, which inferred strength is used to estimate time walk Tw. Time walk Tw represents systematic error arising in raw range measurement due to fluctuations in detected signal strength and timing uniformities, the latter arising from process-dependent effects. The IC comprising the present invention is realizable with relatively inexpensive CMOS fabrication processes such that multiple data inputs may be incorporated into the IC without incurring significant additional cost.

The present invention is used with a zone protection system that includes a laser transmitter and photo detector that together define a coaxial field of view. A motor and mirror assembly cause emitted laser pulses and the detector field of view to scan a two-dimensional protection zone. The laser is pulsed with a specified frequency and in synchronously with motor-mirror rotation. A reference target is disposed within the zone protection system housing to reflect a portion of the transmitted energy back to the photo detector for use in compensating the present invention against system thermal drift.

In making time measurements, the present invention eliminates high speed clocks and high speed digital counters such as are commonly employed in prior art time-of-flight measurements. Instead, the present invention derives a START pulse from the laser drive signal (LASER START). This pulse is input to a latch whose output signal is propagated through a tapped delay line portion of a tapped delay line register (TDLR). The tapped delay line comprises preferably 512 buffers that each contribute an incremental time delay to the latch signal.

The detected return pulse is coupled to a bank of comparators (e.g., four comparators denoted CH0, CH1, CH2, CH3) that test the pulse against different threshold magnitudes. The comparator bank output signals are input to the TDLR, namely to individual channel registers that are also coupled to the preferably 512 delays from the tapped delay line register. The TDLR also receives the detector signal returned from the reference target. The TDLR is coupled to a microprocessor for readout, the microprocessor having access to a look-up table (LUT) that contains timing walk information that can be used to correct system errors.

The latched START pulse functions as a clock signal for the TDLR and clocks the detection data output from the comparator bank. The START-clocked TDLR, which preferably has four data inputs, functions in a manner similar to a two-bit transient recorder that clocks synchronously with the LASER START signal and can provide four signal values. For each data channel, the TDLR outputs a first over threshold (FOT) signal proportional to the rising edge of the first detected return pulse. FOT may be treated as the first 0-to-1 transition of the detected pulse signal. The FOT enables the microprocessor to provide a measure of time delay and thus of distance X to the target that returned the detected pulse. By itself the FOT can thus serve to approximate distance X. However the TDLR further determines and outputs a total time over threshold signal (TOT) that is proportional to how long the detected pulse energy exceeded a threshold. The TOT may be considered as how long the detected signal, after transitioning 0-to-1 remains at 1 before transitioning from 1-to-0. The TOT information permits the microprocessor to infer strength of the returned pulse, including rising and fall transition slopes and pulse width. The inferred strength information is used to index previously stored timing correction information in the look-up table. Such timing correction information will have been obtained during the system design by examining timing walk behavior of the system. The look-up table permits correction, as needed, to the FOT information. Further, the elimination of high speed clocks and high speed counters permits the system to be battery operated and fabricated as a single integrated circuit.

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 2:
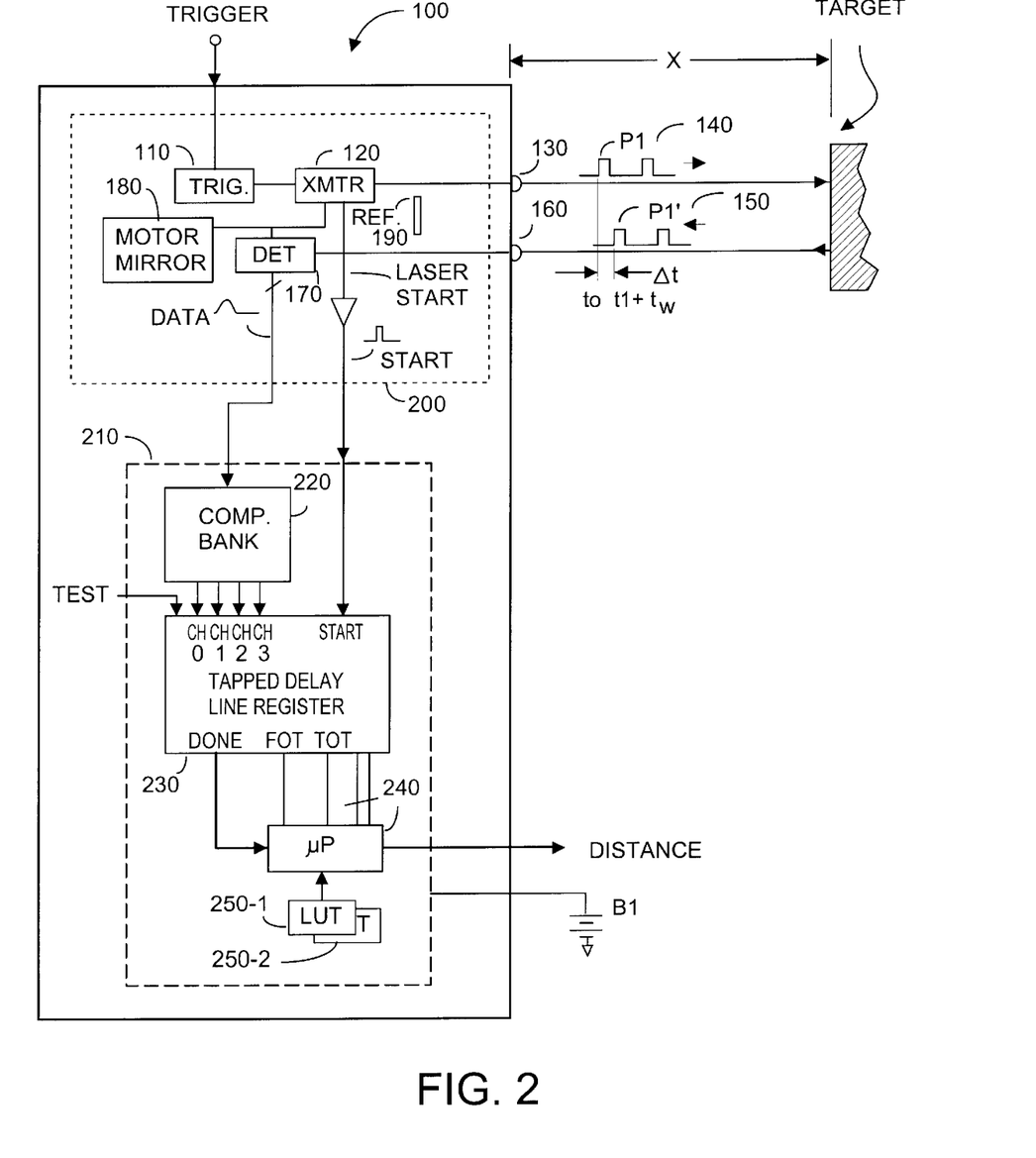
FIG. 2 depicts a time-of-flight interval measurement system, according to the present invention.

FIG. 2 depicts a time-of-flight measurement system 100, according to the present invention. Some components of system 100 may be similar to the prior art system 10 described with respect to FIG. 1. In response to receipt of a current trigger pulse, pulse generator 110 outputs pulses (LASER START) to a laser or other light emitter 120. In response, transmitter 120 energy pulses of perhaps 3 ns to 4 ns, measured at full pulse width, halt magnitude. The LASER START pulse is passed through a comparator to form a START pulse that typically commences some tens of nanoseconds (ns) after commencement of the LASER START pulse.

A lens or other mechanism 130 may be used to collimate or focus the transmitter output energy, shown as idealized pulses 140 having amplitude P1, upon a target located at some distance X from lens 130. In a preferred zone protection system, distance X will represent the perimeter distance within which no intrusion is acceptable. Some emitter optical energy will strike the target (TARGET), e.g., an intruder within the perimeter range, and will be returned toward system 100. The return energy, shown as idealized return pulse train 150 having amplitude P1' enter a lens or the like 160 and are sensed by a detector 170, which preferably comprises avalanche or photo diode detection elements.

Transmitter 120 and detector 170 are configured to provide a coaxial field of view. A motor and mirror assembly 180 functions to scan the coaxial field of view in a plane through an arc defining the zone to be protected. A reference target 190 is disposed within the housing containing at least the transmitter, detector, motor and mirror components such that a reference or test signal may be returned from target 190 for use in correcting distance measurements made by the overall system. Collectively, the above-described units may be referred to a system 200, which system generates a START signal and detection signal (DATA) used by the present invention, which is shown as system 210.

According to the present invention, a time-of-flight time interval measuring system 210 includes a bank of comparators 220, a tapped delay line register 230, a microprocessor 240, and at least one look-up table 250-1, 250-2, etc. Comparator bank 220, shown in detail in FIG. 3A, preferably includes several channels of comparators that compare the incoming DATA signal against separate signal threshold levels. In the preferred embodiment, comparator bank 220 comprises four comparators that output four channels of signal, denoted CH0, CH1, CH2, CH3. Other systems could, however, use fewer or greater than four channels of comparison. Tapped delay line register (TDLR) receives as input the START signal, as well as the preferably four channels of comparator signals, CH0, CJ1, CH2, CH3. A detector signal (TEST) derived from the reference target 190 may also be coupled as input to the TDLR.

Figure 4:
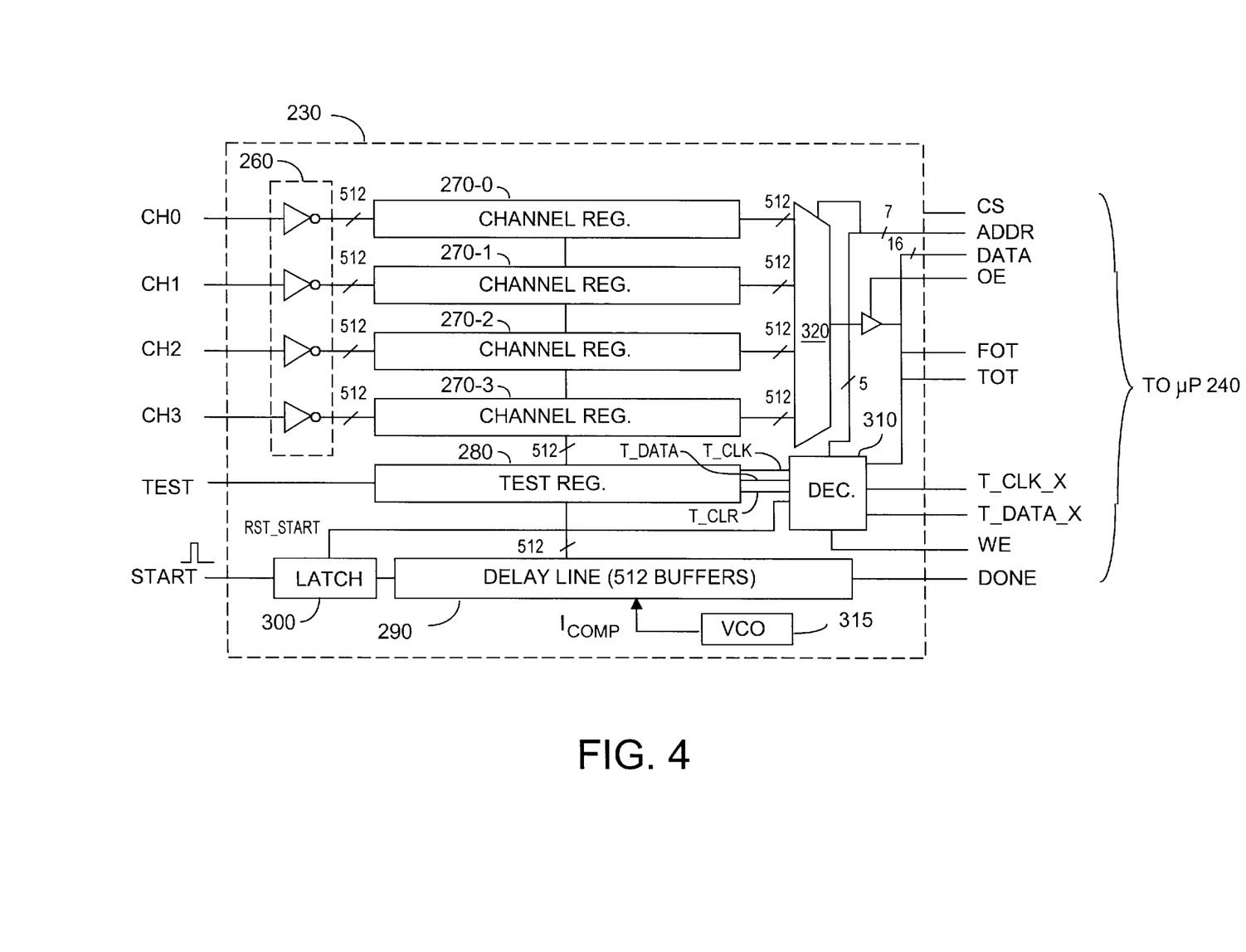
FIG. 4 is an overview block diagram of TDLR 230, according to the present invention.

As described in detail with respect to FIG. 4, TDLR 230 propagates the START signal through a latched tapped delay line, and passes the preferably four channels of DATA through four separate channel registers. The output of the channel registers are multiplexed and decoded. The TDLR outputs DONE, FOT, and TOT signals to a microprocessor 240. A look-up table 250-1 is coupled to the microprocessor. The raw FOT signal alone will enable the microprocessor to calculate distance X to the target returning the detected pulse. However, advantageously the TOT signal characterizes the return pulse and permits the microprocessor to correlate information in the look-up table to make corrections, as needed, for system error in the distance X calculated form the raw FOT signal. If desired, all of system 210 may be fabricated on a single integrated circuit chip, and thus reference numeral 210 may also be understood to refer to the integrated circuit chip. Power consumption for system 210 is sufficiently low, given that no high speed clocks and counters are used, that system 210 may be operated from a battery power source B1, for example about 5 VDC.

Figure 3A:
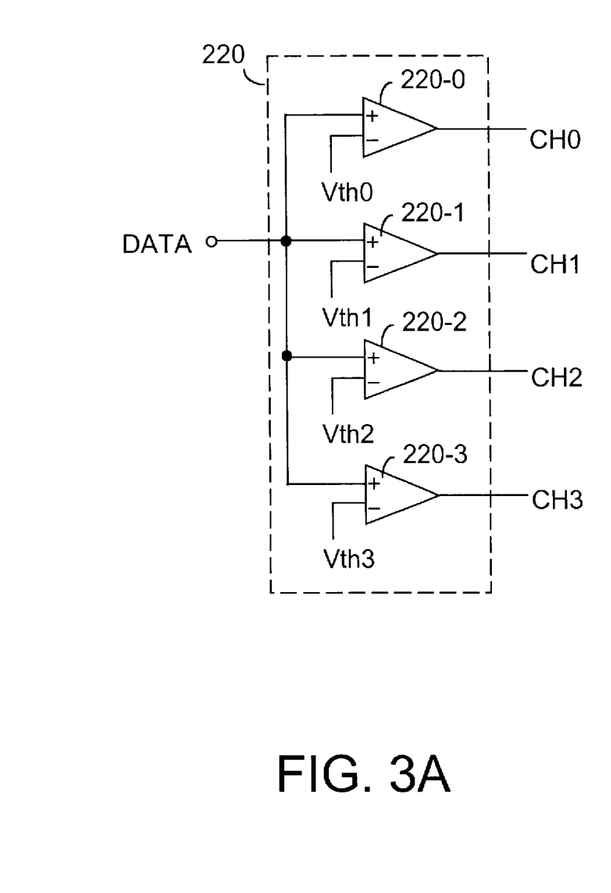
FIG. 3A depicts a multi-channel comparator block for use with a time-of-flight interval measurement system, according to the present invention.
Figure 3B:
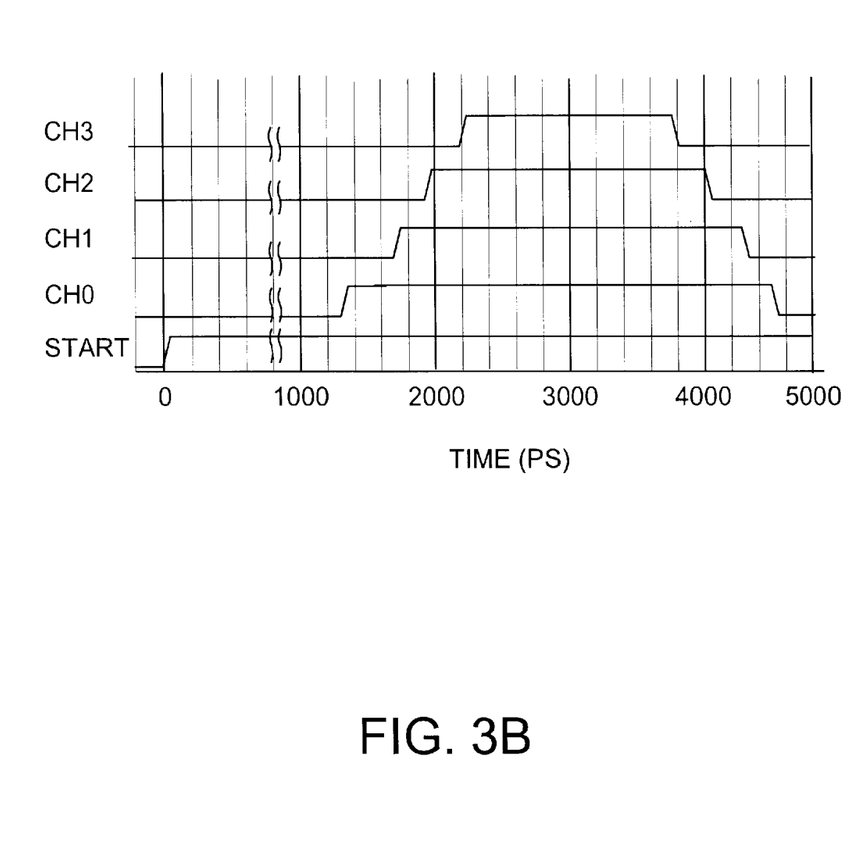
FIG. 3B depicts exemplary comparator channel signals and START signal as a function of time, according to the present invention

FIG. 3A depicts an exemplary comparator block 220, in which four channels of comparator output are provided: CH0, CH1, CH2, CH3. An analog signal (DATA) is coupled as input to the block of comparators, each of which preferably has its own separate threshold voltage level, e.g., Vth0, Vth1, Vth2, Vth3. FIG. 3B is a timing chart depicting the output channels from block 220 and the START signal as a function of time. All time measurements are relative to the START signal, and indeed the START signal commands the TDLR to begin acquiring DATA.

The use of multiple comparators as contrasted with a single comparator advantageously permits a richer definition or characterization of the total shape of the analog-like detected data pulse. For example, in a single channel system comprising only CH0, FOT might be defined as occurring at 1300 ps from beginning of START, e.g., when the detected signal first transitions 0-to-1. (Of course in a complementary system, transitions might be reversed.) TOT based upon CH0 information alone might be 3200 ps, e.g., 4500 ps–1300 ps, or the time CH0 remains at 1 having transitioned 0-to-1. It is seen from FIG. 3B that a sampled snapshot-like image of the DATA waveform in question is captured. If the target from which the acquired data were returned were highly reflective to the transmitted energy, the pulse-like shape observable in FIG. 3B would likely be "fatter" in that CH1, CH2 and CH3 data might look somewhat more similar to CH0 data. This ability to learn more about the target from the shape of the return signal is an advantage provided by the present invention.

It will be appreciated that multiple channels of sampled data also permits parameterization with different comparator thresholds. This flexibility is especially useful where system non-linearity is present and improved measurement precision can result from examining data obtained with a given threshold or thresholds. Further, in addition to providing the ability to measure slightly different information, multiple channels of sampled data provides redundancy. For example ageing of system components on the integrated circuit containing system 210 may be detected by inputting the exact same information to CH0, CH1, CH2, CH3 and determining when over the lifetime of the channels a substantial error begins to appear.

FIG. 4 provides a somewhat more detailed overview of TDLR unit 230. TDLR 230 provides a channel register for each channel of data output by comparator bank 220. Thus, after passing through a buffer 260, CH0 data is passed to a preferably 512-input channel register 270-0, CH1 data is passed to 512-input channel register 270-1, and so forth. As described later herein, each channel register synchronously captures and stores sampled channel signals preferably in 512 D-type flipflops.

The START signal (typically>2 ns wide) represents a start-enabling signal for TDLR 230 and is passed through a latch 300 and into a delay line 290. Latch 300 prevents multiple sampling of the channel data due to any jitter on the START signal. Delay line 290 preferably comprises a series-coupled chain of buffers, e.g., 512 buffers, each of which contributes a single buffer nominal delay of about 200 ps. The individual buffers ideally are identical but in practice are substantially identical, which is to say their individual delays may have a tolerance of up to about ±10%, rather than an ideal ±0%. The output from each of the 512 buffers is coupled to test register 280 and to each of the channel registers 270-0 through 270-3. As described later herein with respect to FIG. 6, preferably a crystal controlled phase lock loop (PLL) controlled VCO circuit 315 functioning at about 49 MHz is included to help compensate for thermal drift within delay line 290 by injecting, as needed, compensation current ICOMP This clock is the only master-type clock found in system 210.

The preferably 512 output lines from each channel register 270-0 through 270-3 are coupled as input to a multiplexer 320. Outputs from test register 280 are coupled as input to a decoder 310, which decoder is enabled by a signal from latch 250. Multiplexer 320 and decoder 310, and delay line 290 output the signals indicated, which signals are coupled to microprocessor 240.

Functionally, the channel registers serve to synchronously sample the incoming CH0, CH1, CH2, CH3 signals with a sample window of approximately 100 ns. Sampling commences with the arrival of the START signal, a 0-to-1 transition being used in the preferred embodiment. In the preferred embodiment, latch 300 cannot be cleared while START remains high at logical 1. A DONE signal is generated by TDLR 230 when the sampling period has terminated and all samples have been taken. This operation is quite different than prior art approaches in which a start pulse would enable a high speed counter or would toggle a high speed clock, and in which a pulse similar to DATA in the present invention would be used as a stop pulse to disable the counter or high speed clock. It will be appreciated that in the present invention, there is no master clock or pulse generator to be stopped.

Microprocessor 240 reads data from TDLR 230, preferably via a 16-bit bus, wherein each data address corresponds to sixteen individual data samples. Each of the four comparator channels preferably has a base address, and offsets to the base address correspond to sequential periods of time for that channel, as captured by the TDLR, which functions as a sampling block. Within a data word, bit 0 corresponds to an earliest sample, while bit 15 corresponds to the latest sample.

Figure 5:
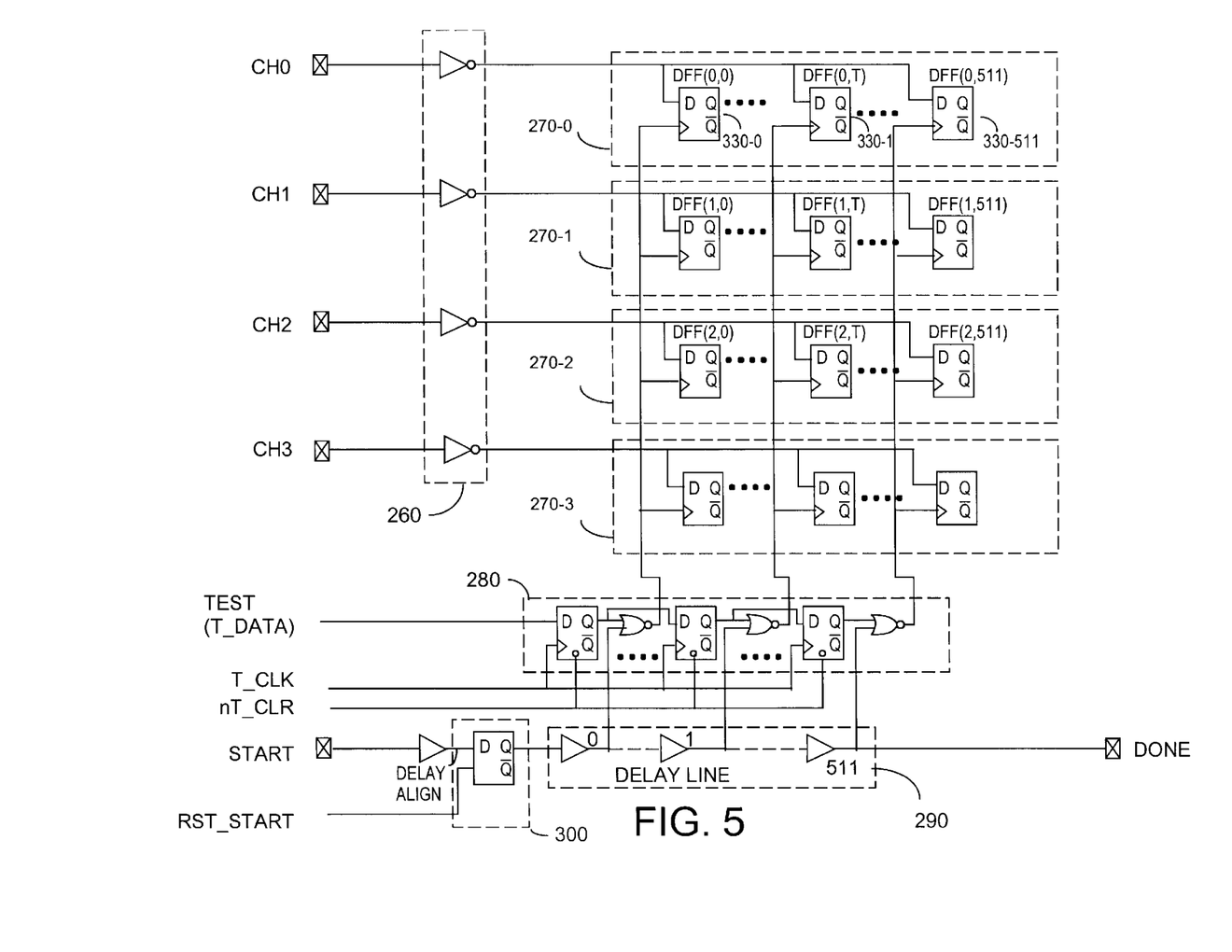
FIG. 5 is a block diagram depicting details as to the channel registers and test register shown in FIG. 4, according to the present invention.

Microprocessor 240 preferably permits serial writing of test vectors to test register 280. When a write is made to a specified address, the least significant bit (LSB) of the DATA bus is read into the first position of the test register, which corresponds to the earliest time slice. The remainder of the test register is shifted, and the bit corresponding to the latest time slice is discarded. During write cycles, the following addresses command TDLR 230 to function as noted, although other mode commanding protocols could instead be adopted:

XX00000 load data from DATA bus into configuration register
XX00001 reset START latch to enable TDLR to acquire new data
XX00010 shift LSB of DATA to test register
XX00011 clear test register Reference is now made to FIG. 5 in which further details of channel registers 270-0 to 270-3, and tapped delay line 290 are shown. TDLR sampling is based upon timing signals available from tapped delay line 290, which preferable comprises a series-connected chain of 512 digital buffers. Rather than use an explicit clock signal, TDLR 230 uses sampling signals available from the individual buffers, each of which contributes a time delay. As noted above, the START signal sets a preferably set-reset (SR) latch 300, and the latch output is coupled to the first input of the tapped delay line 290, and will thus self-propagate through delay line 290.

The matrix comprising tapped delay line 290 preferably is 512×4 channels. Typically the FOT and LUT values are subject to microprocessor 240 correction since timing imperfections can exist within the present invention due, for example, to non-uniformity of each buffer delay stage and buffer location. The present invention tries to compensate for buffer-to-buffer variations that are a function of physical location within the array. Eight columns of buffer taps are used, comprising buffers 1–64, 65–128, 129–192, 193–256, and so forth. The various taps can each provide about 200 ps to 220 ps variation. After fabrication of integrated circuit 210, a characterization of timing uniformity may be performed, and at least one look-up table (LUT) 250-1, 250-2, etc. is provided containing time corrections for the various buffers; see FIG. 2. Note that the buffer time correction LUT is not the same LUT that is used for the for the timing walk.

As shown in FIG. 5, preferably a delay component (DELAY ALIGN) is inserted in series between the START pulse and the SR latch to force matching of time delay between the four channel inputs CH0 to CH3 and the START input. As noted, a DONE signal is output from the last buffer (e.g., buffer 511 in the preferred embodiment) comprising tapped delay line 290.

An individual one of the preferably 512 buffers comprising tapped delay line 290 may be referred to as CB(T), where T is a number corresponding to the buffer position within the chain of buffers, $0 \leq T \leq 511$. Using this nomenclature, START is input to CB(0), and DONE is output from CB(511).

As shown by FIGS. 4 and 5, test register 280 is disposed between tapped delay line 290 and the four channel capture registers 270-0 to 270-3. Test register 280 provides a mask to control sampling of the capture registers, and for every CB(T) tap output from delay line 290 there is one flipflop in test register 280. As shown in FIG. 5, preferably the tap from the delay line 290 and the output from a flipflop in test register 280 are input to a NOR gate whose output is coupled to the clock inputs of four corresponding D-type flipflops, one flipflop in each of the channel registers 270-0 through 270-3.

If the flipflop in the test register holds a 0, then the NOR gate output transitions 0-to-1 when the tapped signal transitions 1-to-0. If the test register flipflop holds a 1, the NOR gate output is held 0. Test register 280 preferably is a shift register with new data loaded into the bit that controls samplings of the earliest time slices of the four CH0, CH1, CH2, CH3 signals. Data loaded to the test register may be controlled from the DATA bus, or from external pins.

As described early and as shown in FIG. 5, D-type flipflops in the four channel capture registers 270-0 through 270-3 capture every sample acquired by TDLR 230 synchronously with the START pulse. An individual D-type flipflop (DFF) may be referred to as DFF(N,T), where N and T are integers $0 \leq N \leq 3$, and $0 \leq T \leq 511$ that respectively represent the channel register to which the DFF belongs and the section of the overall sampling period captured by that flipflop. Thus, the output of DFF(2,55) denotes the state of CH2 when the 55th sample occurred. The clock (CLK) inputs of DFF(0,T), DFF (1,T), DFF(2,T) and DFF(3,T) are coupled to the output of CB(T), and the D input of DFF(N,T) is coupled to the ChN input to the TDLR system.

In the preferred embodiment, every data sample captured by TDLR 230 preferably is addressable as part of a 16-bit data word, and as shown in FIG. 4, multiplexer, decoder, and associated combinatorial logic components are used to place values from the various D-type flipflops on the DATA bus. The protocol used was described earlier, namely each address corresponds to 16 individual samples identifiable with channel base and time period offset values. Thus, address 0×55 results in the DATA(0:15) outputs corresponding to D-type flipflops (2,366:351).

Preferably during a write cycle with address 00000, values from the DATA(2:1) bus are written to a configuration register, whose three-bits are used as follows:

Config(1): F_OUT_DIS disables output frequency from the phase lock loop (PLL) associated with VCO 315 in FIG. 4;

0=>the PLL frequency is output to F_OUT pin, whereas 1=>F_OUT pin is high impedance;

Config(2): TEST_SELECT selects whether data and clock for test register 280 shall come from the bus interface or from circuit pins;

0=>test register 280 controlled from bus, whereas 1=>test register controlled from pins.

Preferably TDLR 230 has a global output enable ability such that when this signal is 0, all outputs from the integrated circuit containing TDLR 230 (and associated circuitry) behave as described. However when the global enable signal is 1, preferably DATA and DONE outputs go to high impedance, and the VCO PLL 315 (see FIG. 4) powers down, which causes the F_OUT pin not to be driven.

Figure 6:
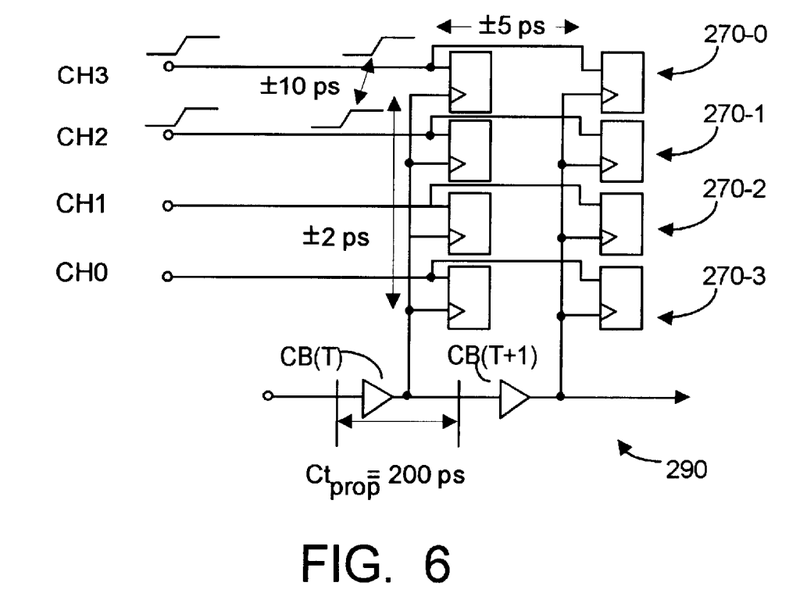
FIG. 6 depicts timing requirement for a preferred embodiment of a tapped delay line register, according to the present invention.

FIG. 6 depicts a portion of channel registers 270-0 through 270-3, and a portion of delay line tapped register 290, to illustrate timing requirements. Let $Ct_{prop}$ 9=(T) denote the time difference, including delays from propagation and wiring, between the rising edges of the output of adjacent buffer elements CB(T) and CB(T+1) within delay line tapped register 290. Nominally each element DB(T) has a propagation delay of about 200 ps, but the amount of delay per element can vary due, for example, to fabrication differences from element to element, and especially due to thermal drift in the circuitry itself.

In an ideal delay line 290, the accumulated delay after a number N of series-connected buffers would be (N)(200), where 200 ps is the nominal per buffer delay. But fabrication variations of the buffers can result in too much or too little delay for different ones of the 512 buffers, and different physical location on the integrated circuit die on which system 210 is fabricated can also result in delay variations. As noted, before packing the integrated circuit, a calibration pulse is propagated through tapped delay line 290, and the actual delay at various tap points within the series of delay buffers is measured. A correlation between buffer tap location and actual delay can be made, and corrected values, where needed, can be stored, for example in look-up table 250-1, 250-2, etc. for use by microprocessor 240. (see FIGS. 2 and 4).

PLL-controlled VCO 315 can control at least some of the supply current ($I_{COMP}$) to the buffers comprising delay line 290. PLL 315 can control delay within delay line 290 such that thermal drift effects upon the nominal 200 ps per buffer delay do not vary by more than about±10%, which delays typically increase with increasing temperature. This level of compensation can be maintained for all process variations including mismatch between PLL 315 and the buffers comprising the tapped delay line register 290. Further, total propagation time from the START input to the DONE output signals in the tapped delay line can be held to within about±5% from integrated circuit chip to integrated circuit chip.

Figure 7:
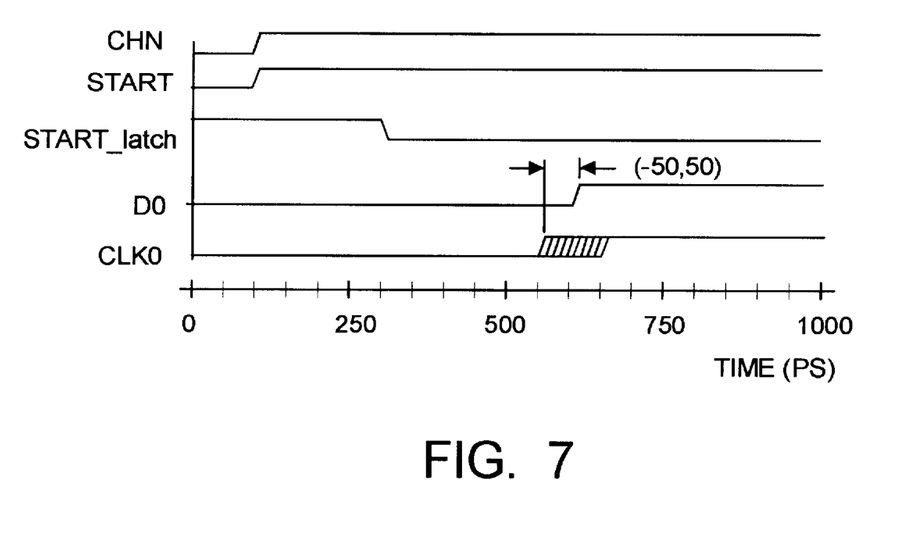
FIG. 7 depicts START pulse matching, according to the present invention.

Referring to FIGS. 6 and 7, preferably the individual D-type flipflops, e.g., 330-0, 330-1, etc. comprising the four channels of capture registers 270-0 through 270-3 are laid out on the integrated circuit chip such that a maximum time difference between arrival of a 0-to-1 signal edge arriving from a channel input to any of the D-flipflop inputs within a channel is about 10 ps. Likewise, two 0-to-1 edges presented to channel register inputs should arrive at their respective D-type flipflop inputs within a column separated by more than 20 ps. Further, the 0-to-1 edge from the NOR gates in test register 280 must reach the CLK inputs of the D-type flipflops with less than about 2 ps time separation.

As shown in FIG. 5, a delay-align element is preferably present between the START pulse and the latch 300 to ensure that two 0-to-1 signal edges presented simultaneously at START and at the ChN inputs will fall within about 50 ps of each other upon arrival at the CLK and the D-inputs to DFF(N,O). Within a channel register, all D-type flipflops receive their D input signals from a common source, namely the ChN input. Distribution of this signal preferably holds skew to within 10 ps between arrival of a signal at any D-type flipflop in the same channel register. It will be appreciated that during signal transitions occurring during a time window between setup and hold will not yield reproducible results, and accordingly the setup-hold window differential is less than about 50 ps.

Within the channel registers, four D-type flipflops will sample simultaneously and their outputs are multiplexed to a single signal based upon the two most significant bits of the address. Thus, time from valid address inputs to time of valid output from multiplexer 320 (FIG. 4) is preferably less than about 2.25 ns.

Each digital sample stored in TDLR 230 represents the state of one of the inputs at a given point in time, and it is these states that are readout by microprocessor 240 to determine time of the 0-to-1 and the 1-to-0 transitions in deriving FOT and TOT.

Signal measurement error due to granularity results from the fact that signals are measured at finite points, and the separation between measurement points will define the maximum accuracy with which system 210 can detect time of a transition in a signal. Using a nominal 200 ps sampling window interval with a±10% variation, 220 ps would represent worst case error due to granularity. However microprocessor 240 may assume that the sample corresponds to a point midway between it and the preceding sample such that time-of-flight error due to granularity is about±110 ps. Setup/hold violation means a transition occurring within the sample window between setup and hold time is essentially meaningless. Using a design goal of a sample window with no more than about 50 ps uncertainty will contribute an additional±50 ps to granularity. There is also a tolerance associated with characterization, given that the leading edge of a sample occurs within a given channel register bin, whose translation to time cannot be achieved with accuracy greater than the tolerance with which the characterization of the integrated circuit chip is known. The resultant measurement error can readily contribute an additional ±90 ps to time-of-flight measurement error. Finally, uniformity of the distribution of data input to the D-type flipflops is not absolute, and is assured only to within about±10 ps. Adding the above errors indicates that the present invention can measure time-of-flight within about±260 ps.

In the preferred embodiment, system 210 was fabricated on a 4 mm ×4 mm chip (also denoted 210), using a 0.5 μm CMOS process and commercial cell libraries for the various flipflop and buffers. Unlike prior art time-of-flight measurement systems, the present invention may be battery operated in that power consuming and heat generating components such as high speed master clocks and high speed digital counters are not required. A further benefit is that substantially less electromagnetic interference (EMI) is generated by the present invention than by prior art systems, which means a less costly enclosure can suffice, since EMI shielding requirements are less stringent. Further cost to implement the present invention can be substantially less than to implement prior art systems yet is more robust and provides excellent time resolution granularity.

Modifications and variations may be made to the disclosed embodiments without departing from the subject and spirit of the invention as defined by the following claims.

What is claimed is:

1. A clockless method of measuring time of flight in a system that outputs an energy pulse correlatable with a START pulse, and that detects a DATA signal reflected from a target, the method comprising the following steps:
    (a) providing a tapped delay line comprising a series-coupled chain of N substantially identical delay elements, denoted D(x) where $0 \leq x \leq N-1$;
    (b) coupling said START pulse as input to a latch circuit;
    (c) coupling an output from said latch circuit to an input of said tapped digital delay line such that the latched START pulse propagates through said N delay elements;
    (d) providing a channel register comprising N series-coupled storage elements, denoted FF(x) where $0 \leq \leq N-1$;
    (e) coupling said DATA signal to a comparator block;
    (f) coupling an output of said comparator block to an input of said channel register; and
    (g) synchronously clocking storage element FF(x) with a delayed version of said latched START pulse from delay element D(x) to sample said output of said comparator block; and
    (h) digitally processing signal information available from step (f) to determine at least one of (i) first time over threshold of said DATA signal, and (ii) total time over threshold of said DATA signal.

2. The method of claim 1, wherein:
step (d) includes providing Z said channel registers, each comprising N series-coupled storage elements, denoted FF(x) where $0 \leq x \leq N-1$;
step (e) includes coupling said DATA signal in parallel to a comparator block comprising Z comparators, each having a different threshold level of comparison; and
(f) includes coupling a first output of said comparator block to an input of a first of said Z channel registers, coupling a second output of said comparator block to an input of a second of said Z channel registers, and so on until each comparator block output is coupled to an input of an associated one of said Z channel registers.

3. The method of claim 1, wherein:
step (a) includes measuring time delay provided at an output of at least two of said delay elements responsive to a reference said DATA signal and storing measured delay information for said two delay elements in a look-up table; and step (e) includes correcting at least one determination using information from said look-up table.

4. The met hod of claim 1 wherein said method is carried out by circuitry implemented on a single integrated circuit.

5. The method of claim 1, wherein:
step (a) includes implementing said tapped digital delay line with N integrated circuit buffers that each contribute a time delay of 200 ps ±10%.

6. The method of claim 1, wherein:
step (b) includes compensating for delay differential between beginning of said START signal and each input to said comparator block.

7. The method of claim 1, wherein:
step (d) includes providing D-type flipflops as said storage elements.

8. The method of claim 1, wherein:
step (a) includes compensating at least some of said delay elements for per-element variation in delay due to thermal drift.

9. The method of claim 1, wherein step (g) includes providing a test register to control sampling by said channel register.

10. A circuit to determine time-of-flight, useable with a system that includes a transmitter that outputs an energy pulse correlatable with a START pulse, and includes a detector that detects a DATA signal reflected from a target, the circuit comprising:
    a tapped delay line comprising a series-coupled chain of N substantially identical delay elements, denoted D(x) where $0 \leq x \leq N-1$;
    a latch circuit coupled to receive as input said START pulse, and outputting a latched version of said START pulse as input to said tapped delay line, said tapped delay line outputting a plurality of incrementally delayed versions of the latched said START pulse;
    a channel register comprising N series-coupled storage elements, denoted FF(x) where $0 \leq x \leq N-1$;
    a comparator block coupled to receive said DATA signal as input, and outputting a comparator signal to an input of said channel register; and
    wherein said storage element FF(x) is synchronously clocked with a delayed version of the latched START signal from delay element D(x); and
    a microprocessor coupled to said channel register to determine at least one of (a) first time over threshold of said DATA signal, and (b) total time over threshold of said DATA signal.

11. The circuit of claim 10, wherein said circuit is fabricated as a single integrated circuit.

12. The circuit of claim 10, including:
    Z said channel registers, each comprising N series-coupled storage elements, denoted FF(x) where $0 \leq x \leq N-1$;
    wherein said comparator block comprises Z comparators each having a different threshold of comparison, an input of each of said Z comparators being coupled to receive said DATA signal;
    wherein a first output of said comparator block is coupled to an input of a first of said Z channel registers, a second output of said comparator block is coupled to an input of a second of said Z channel registers, and so on until each comparator block output is coupled to an input of an associated one of said Z channel registers.

13. The circuit of claim 10, further including a look-up table containing timing information correlating discrepancy in time delay associated with at least some of said delay elements;

wherein said microprocessor can use said timing walk information to correct at least one time determination made by said circuit.

14. The circuit of claim 10, wherein: said tapped delay line comprises 512 integrated circuit buffers that each contribute a time delay of 200 ps ±10%.

15. The circuit of claim 10, further including means for compensating for delay differential between beginning of said START signal and each input to said comparator block.

16. The circuit of claim 10, wherein said storage elements include D-type flipflops.

17. The circuit of claim 10, further including means for compensating at least some of said delay elements for per-element variation in delay due to thermal drift.

18. The circuit of claim 10, further including a test register to control sampling by said channel register.

19. A time of flight measurement system, comprising: a transmitter unit that emits a pulse of energy response to a trigger pulse correlatable to a START pulse;
   a detector that outputs a DATA signal response to detection of a portion of said energy reflected from a target;
   a clockless time-measurement circuit comprising:
   a tapped delay line comprising a series-coupled chain of N substantially identical delay elements, denoted $D(x)$ where $0 \leq x \leq N-1$;
   a latch circuit coupled to receive as input said START pulse, and outputting a latched version of said START pulse as input to said tapped delay line, said tapped delay line outputting a plurality of incrementally delayed versions of the latched said START pulse;
   a channel register comprising N series-coupled storage elements, denoted $FF(x)$ where $0 \leq x \leq N-1$;
   a comparator block coupled to receive said DATA signal as input, and outputting a comparator signal to an input of said channel register; and
   wherein said storage element $FF(x)$ is synchronously clocked with a delayed version of the latched START signal from delay element $D(x)$; and
   a microprocessor coupled to said channel register to determine at least one of (a) first time over threshold of said DATA signal, and (b) total time over threshold of said DATA signal.

20. The time of flight measurement system of claim 19, wherein said clockless time-measurement circuit is fabricated on a single integrated circuit.

21. A method of measuring a time of flight laser pulse the method comprising :
   emitting a laser pulse directed towards the object;
   initiating a sequence of control signals that are sequentially generated at discrete intervals of time upon emitting the laser pulse;
   asserting a first signal when a return reflection signal is above a first threshold, the return reflection signal being responsive to reflected laser energy from the object;
   recording a state of the first signal at successive sampling points under control of the sequence of control signals;
   determining the time of light of laser pulse using the recorded states of the first signal to determine when the first signal was asserted relative to when the laser pulse was emitted.

22. The method of claim 21 wherein initiating a sequence of control signals that are sequentially generated at discrete intervals of time upon emitting the laser pulse comprises:
   generating a start signal coincident with emitting the laser pulse; and
   propagating the start signal through a digital delay line comprising a series of delay stages, wherein each one of the delay stages outputs a corresponding one of the sequentially generated control signals, such that the successive sampling points are spaced apart at successive intervals of time.

23. The method of claim 21 wherein recording a state of the first signal at successive sampling points under control of the sequence of control signals comprises:
   coupling the first signal to a first set of parallel digital registers; and
   latching the state of the first signal into respective ones of the digital registers in the first set of digital registers via the sequentially generated control signals.

24. The method of claim 23 further comprising clearing the first set of digital registers before emitting a subsequent laser pulse in a subsequent distance measurement.

25. The method of claim 23 further comprising operating the first set of digital registers as a first capture channel, such that the first capture channel begins recording the state of the first signal at the successive sample points upon emitting the laser pulse.

26. The method of claim 25 further comprising:
   asserting one or more additional signals when the return reflection signal is above, respectively, one or more additional thresholds positioned above the first threshold; and
   recording the state of the one or more additional signals at the successive sampling points in a corresponding one or more additional capture channels; and
   wherein the first and one or more additional capture channels form a plurality of capture channels.

27. The method of claim 26 further comprising deriving one or more characteristics of the return reflection signal based on the recorded states of the first and one or more additional signals stored in the plurality of capture channels.

28. The method of claim 27 further comprising compensating the determined time flight of a laser pulse to the object based on the derived one or more characteristics of the return reflection signal.

29. The method of claim 28 wherein deriving one or more characteristics of the return reflection signal based on the recorded states of the first and one or more additional signals stored in the plurality of capture channels comprises estimating a signal strength of the return reflection signal by determining which ones of the first and one or more additional thresholds were exceeded by the return reflection signal.

30. The method of claim 28 wherein compensating the determined time flight of laser pulse the object based on the derived one or more characteristics of the return reflection signal comprises performing a time-walk correction on the determined time flight of laser pulse to the object based on the estimated signal strength of the return reflection signal.

31. The method of claim 28 wherein deriving one or more characteristics of the return reflection signal based on the recorded states of the first and one or more additional signals stored in the plurality of capture channels comprises estimating a pulse shape traced by the return reflection signal based on determining a time over threshold for the first and one or more additional thresholds.

32. The method of claim 21 further comprising:
   recording a plurality of transitions in the first signal corresponding to receiving multiple return reflections of laser energy in response to said laser pulse; and
   determining the time flight of laser pulse associated with one or more of the multiple return reflections.

33. The method of claim 32 further comprising compensating the determined distances associated with said one or more of said multiple return reflections.

34. A method of determining a distance to an object, the method comprising:

emitting a laser pulse directed towards the object;

receiving a return reflection from the object;

initiating a sequence of successive sampling signals generated at spaced apart intervals of time upon emission of the laser pulse;

recording a state of a first comparator signal over a plurality of sampling points under control of the successive sampling signals, wherein the first comparator signal is asserted when a return signal responsive to the return reflection exceeds a first signal threshold;

determining the distance to the object using the recorded states of the first comparator signal to determine when the first comparator signal was asserted relative to the emission of the laser pulse.

35. The method of claim 34 further comprising:

recording a state of each one of one or more additional comparator signals over the plurality of sampling points, wherein the one or more additional comparator signals are respectively asserted when the return signal exceeds a corresponding one or more additional signal thresholds positioned above the first signal threshold;

deriving one or more characteristics of the return reflection based on the recorded states of the first and one or more additional comparator signals; and compensating the determined distance to the object based on the one or more derived characteristics of the return reflection.

36. The method of claim 35 wherein deriving one or more characteristics of the return reflection based on the recorded states of the first and one or more additional comparator signals comprises:

determining time-over-threshold information for the return signal with respect to at least one of the first and one or more additional signal thresholds; and inferring a pulse strength of the return reflection from the time-over-threshold information.

37. The method of claim 36 wherein compensating the determined distance to the object based on the one or more derived characteristics of the return reflection comprises:

accessing stored time-walk information based on the inferred pulse strength of the return reflection; and correcting the determined distance to the object based on the stored time-walk information.

38. The method of claim 35 wherein deriving one or more characteristics of the return reflection based on the recorded states of the first and one or more additional comparator signals comprises:

determining time-over-threshold information for the return signal with respect to at least one of the first and one or more additional signal strength thresholds; and inferring a pulse shape of the return reflection from the time-over-threshold information.

39. The method of claim 38 wherein compensating the determined distance to the object based on the one or more derived characteristics of the return reflection comprises:

accessing stored time-walk information based on the inferred pulse shape of the return reflection; and correcting the determined distance to the object based on the stored time-walk information.

40. The method of claim 34 further comprising:

receiving a plurality of return reflections from one or more objects;

recording a plurality of transitions of said first comparator signal corresponding to said plurality of return reflections; and determining the distances associated with at least some of said plurality of return reflections.

41. A method of determining a distance to an object, the method comprising:

emitting a laser pulse directed towards the object;

receiving a return reflection from the object;

sampling a return signal responsive to the return reflection using sequential sampling signals generated by a digital delay line having sequential delay outputs to determine a time interval between emitting the laser pulse and receiving the return reflection; and determining the distance to the object based on the time interval.

42. The method of claim 41 further comprising initiating the sequential sampling signals synchronous with emission of the laser pulse by directing a start signal coincident with the laser pulse into a beginning of said digital delay line, such that propagation of the start signal through the digital delay line generates the sequential sampling signals.

43. The method of claim 41 wherein sampling a return signal responsive to the return reflection using sequential sampling signals generated by a digital delay line having sequential delay outputs comprises:

distributing said return signal to a parallel set of digital capture registers; and capturing a state of the return signal at sequential sampling times by latching respective ones of said capture registers in sequence using said sequential sampling signals.

44. The method of claim 41 wherein determining a distance to the object based on the time interval comprises:

determining when the return signal was first asserted relative to emitting the laser pulse by determining a first one of the capture registers to record the return signal in an asserted state; and calculating an offset time relative to a beginning of the digital delay line for the sequential sampling signal latching the first one of the capture registers, which offset time represents an uncompensated time-of-flight value for the emitted laser pulse.

45. The method of claim 44 further comprising:

determining when the return signal is de-asserted to determine a return signal pulse width by examining the captured states of the return signal; and compensating the determined distance to the object based on the return signal pulse width.

46. The method of claim 41 further comprising:

comparing the return signal to multiple signal strength thresholds to generate a plurality of threshold signals;

sampling said threshold signals using said sequential sampling signals;

determining a time-over-threshold value for one or more of the plurality of threshold signal; and compensating the determined distance to the object based on one or more of the time-over-threshold values.

* * * * *

UNITED STATES PATENT AND TRADEMARK OFFICE
CERTIFICATE OF CORRECTION

PATENT NO.    : 6,493,653 B1                                                   Page 1 of 1
DATED         : December 10, 2002
INVENTOR(S)   : Drinkard et al.

It is certified that error appears in the above-identified patent and that said Letters Patent is hereby corrected as shown below:

Column 13,
Line 45, "time of flight laser pulse" should be -- time-of-flight for a laser pulse --.
Line 47, "the object" should be -- an object --.
Line 56, "time of flight laser pulse using" should be -- time-of-flight for a laser pulse by using --.

Column 14,
Line 15, "distance" should be -- time-of-flight --.
Line 36, "time of flight of a laser pulse to the object" should be -- time-of-flight for a laser pulse of --.
Line 47, "time flight of laser pulse the object", should be -- time-of-flight for a laser pulse --.
Line 50, "time flight of laser pulse" should be -- time-of-flight for a laser pulse --;
Line 66, "distance" should be -- time-of-flight for a laser pulse --.

Column 15,
Line 1, "distance to an object" should be -- time-of-flight for a laser pulse --;
Line 3, "the object" should be -- an object --;
Lines 14, 29, 46 and 63, "distance to the object" should be -- time-of-flight for a laser pulse --;
Line 42, "distance to the object" should be -- time-of-flight for a laser pulse --.

Column 16,
Line 7, "distance" should be -- time-of-flight for a laser pulse --;
Line 9, "distance to an object" should be -- time-of-flight for a laser pulse --;
Lines 19, 38, 52 and 61, "distance to the object" should be -- time-of-flight for a laser pulse --.

Signed and Sealed this

Twenty-ninth Day of July, 2003

JAMES E. ROGAN
*Director of the United States Patent and Trademark Office*